(12) United States Patent
Huang

(10) Patent No.: US 9,563,396 B2
(45) Date of Patent: Feb. 7, 2017

(54) GATE DRIVING CIRCUIT AND DISPLAY DEVICE

(71) Applicants: Xiamen Tianma Micro-Electronics Co., Ltd., Xiamen (CN); Tianma Micro-Electronics Co., Ltd., Shenzhen (CN)

(72) Inventor: Qiangcan Huang, Xiamen (CN)

(73) Assignees: XIAMEN TIANMA MICRO-ELECTRONICS CO., LTD., Xiamen (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 351 days.

(21) Appl. No.: 14/306,196

(22) Filed: Jun. 16, 2014

(65) Prior Publication Data

US 2015/0186112 A1  Jul. 2, 2015

(30) Foreign Application Priority Data

Dec. 31, 2013  (CN) .......................... 2013 1 0754900

(51) Int. Cl.
 G06F 5/01  (2006.01)
 G09G 3/20  (2006.01)
 G11C 19/28  (2006.01)
(52) U.S. Cl.
 CPC ........ *G06F 5/01* (2013.01); *G09G 3/20* (2013.01); *G11C 19/28* (2013.01); *G09G 2310/0286* (2013.01)
(58) Field of Classification Search
 None
 See application file for complete search history.

(56) References Cited

U.S. PATENT DOCUMENTS

| 6,232,946 B1* | 5/2001 | Brownlow | G09G 3/2011 345/100 |
|---|---|---|---|
| 6,670,943 B1* | 12/2003 | Ishii | G09G 3/3677 345/100 |
| 2001/0022581 A1* | 9/2001 | Koyama | G09G 3/3688 345/204 |
| 2003/0034939 A1 | 2/2003 | Moon | |
| 2005/0264551 A1* | 12/2005 | Hsieh | G09G 3/20 345/204 |
| 2006/0044296 A1* | 3/2006 | Murade | G09G 3/3648 345/204 |
| 2006/0181490 A1* | 8/2006 | Ozaki | G09G 3/2022 345/76 |

FOREIGN PATENT DOCUMENTS

| CN | 102881248 A | 1/2013 |
|---|---|---|
| DE | 10337530 A1 | 7/2004 |

\* cited by examiner

*Primary Examiner* — Michael D Yaary
(74) *Attorney, Agent, or Firm* — Alston & Bird LLP

(57) ABSTRACT

The present invention discloses a gate driving circuit and a display device having the same. The gate driving circuit includes a logic circuit, a plurality of shift register units and enable circuits. The logic circuit is configured to receive a first clock signal, a second clock signal, a third clock signal, and a fourth signal, and output a logic pulse signal for driving the plurality of shift register units and enable circuits. Each of the plurality of enable circuits is connected with one of the plurality of shift register units and configured to receive a first pulse signal outputted by one of the plurality of shift register units and the logic pulse signal outputted by the logic circuit, and output two second pulse signals to drive two respective gate lines.

12 Claims, 9 Drawing Sheets

GATE DRIVING CIRCUIT AND DISPLAY DEVICE

CROSS-REFERENCES TO RELATED APPLICATIONS

This application claims the benefit of priority to Chinese Patent Application No. 201310754900.0, filed with the Chinese Patent Office on Dec. 31, 2013 and entitled "GATE DRIVING CIRCUIT AND DISPLAY DEVICE", the content of which is incorporated herein by reference in its entirety.

TECHNICAL FIELD

The present invention relates to the field of display technologies, in particular to a gate driving circuit and a display device having the same.

BACKGROUND OF THE INVENTION

Currently, a Thin Film Field Effect Transistor display panel includes: an effective display region AA containing a plurality of pixel electrodes, a Vertical Shift Register (VSR) configured to turn on and turn off a Thin Film Transistor (TFT) connected with each of the pixel electrodes in the display region AA, and an integrated circuit (IC) chip configured to provide signals to the VSR. FIG. 1 is a schematic view showing the structure of the TFT display panel in the prior art.

FIG. 2 is a schematic view showing the structure of a gate driving circuit with the VSR in the prior art. As shown in FIG. 2, the VSR includes a plurality of cascaded Shift Register (SR) units, a signal line providing a start pulse signal STV, a signal line providing a reset signal GRESET, a signal line providing a first clock signal (CLK1) and a signal line providing a second clock signal (CLK2). Each of the stages of the VSR circuit includes one SR unit, and pulses of the first clock signal CLK1 and pulses of the second clock signal CLK2 are alternatively provided to implement the function of the SR unit by an enable circuit, where the first pulse of the first clock signal CLK1 occurs within the time duration of a pulse of the start pulse signal STV. FIG. 3 is a timing diagram showing the operation of SR units of the left VSR, where a phase of the first clock signal CLK1 is inverse to that of the second clock signal CLK2. The operation process of the gate driving circuit is as follows: when STV=1, a high level pulse is outputted to an input end of the shift register unit SR1 connected with a first row of the pixel units, so that the first stage of shift register unit SR1 is turned on to output a high gate level to the TFT display panel, but the other stages of shift register units are turned off, meanwhile, an input end of the next stage of shift register unit SR3 is applied by a high level pulse to turn on the shift register unit SR3. When the shift register unit SR3 outputs a high level signal, the other stages of the shift register units are turned off, meanwhile, an input end of the next stage of shift register unit SR5 is applied by a high level pulse, and so on, until the last stage of shift register unit is applied by a high level pulse. Output signals of the various shift register units SR1 to SR2N−1 are represented by OUT1 to OUT2N−1, as shown in FIG. 3.

In the technical solution described above, each of the shift register units controls only one gate line. Since the shift register units occupy more than 40% of the area of the VSR, it is difficult to achieve a narrow frame design because of the large number of VSR TFTs required.

BRIEF SUMMARY OF THE INVENTION

In view of this, embodiments of the present invention provide a gate driving circuit and a display device having the same, where one shift register unit is configured to control two gate lines to reduce the number of the shift register units, thereby reducing the wiring space and realizing a narrow frame of a TFT display panel.

According to an embodiment, a gate driving circuit comprising a plurality of shift registers units includes: a logic circuit configured to receive a first clock signal, a second clock signal, a third clock signal and a fourth signal, and output a logic pulse signal driving the plurality of shift registers and a plurality of enable circuits. Each of the plurality of enable circuits is connected with one of the plurality of shift register units and configured to receive a first pulse signal outputted by one of the plurality of shift registers and the logic pulse signal outputted by the logic circuit, and to output two second pulse signals to drive two respective gate lines.

Embodiments of the present invention provide a display device. The display device includes: a display region including a plurality of pixels for displaying images, a gate driving circuit configured to transfer scanning signals to the display region, and a data driving circuit configured to transfer data signals to the display region; where the gate driving circuit is one according to any of the embodiments of the present invention.

With the gate driving circuit and the display device provided by the embodiments of the present invention, one shift register unit is configured to control two gate lines to reduce the number of the shift register units, thereby reducing the wiring space and realizing the narrow frame of a TFT display panel.

DETAILED DESCRIPTION OF THE INVENTION

The present invention will be further described in detail below in conjunction with the accompanying drawings and embodiments. It should be noted that the specific embodiments disclosed herein is merely intended for explaining, rather than limiting, the present invention. It should also be noted that the accompanying drawings shows only parts relating to the present invention, but not in an exhausting way, for the ease of description.

With the gate driving circuit provided by the embodiments of the present invention, wiring space can be reduced, thereby realizing the narrow frame of a display panel, thus the gate driving provided by the embodiments of the present invention circuit is particularly suitable for a TFT display panel with a small size.

In an embodiment, a driving signal for driving each of gate lines includes only one square wave pulse within one image frame, that is, each of the gate lines is driven only once in one image frame, and all of the gate lines in an entire display device are driven sequentially by scanning the gate lines one by one. Certainly, the gate lines are not limited to be driven sequentially one by one, instead, the gate lines may be driven by regions, for example, two gate lines are driven by one scan pulse.

Figure 1:
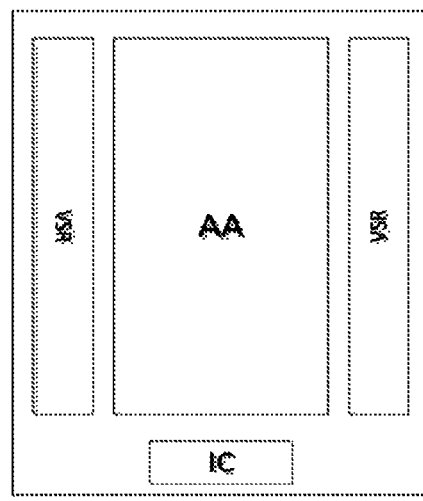
FIG. 1 is a schematic view showing a structure of a TFT display panel in the prior art.
Figure 2:
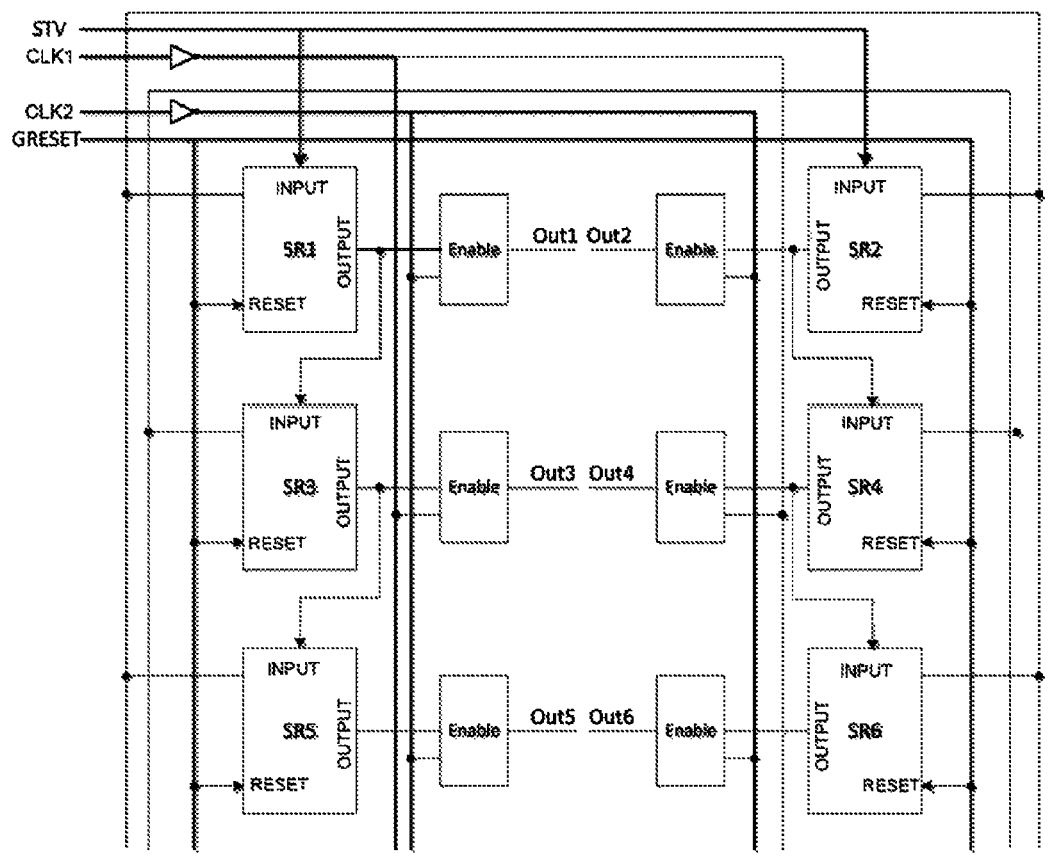
FIG. 2 is a schematic view showing a structure of a gate driving circuit with a VSR in the prior art.
Figure 3:
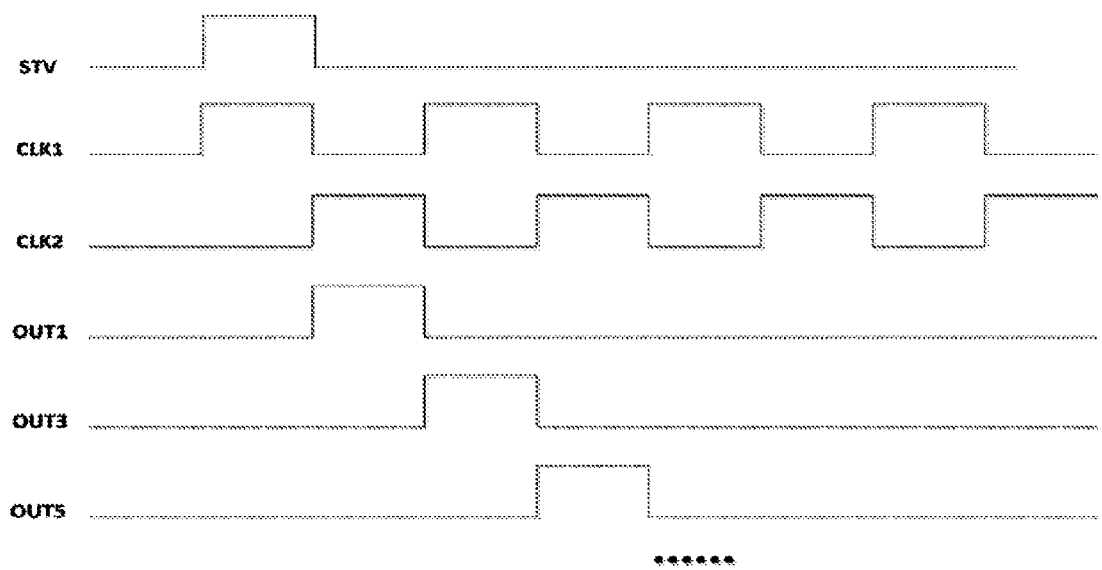
FIG. 3 is a timing diagram showing the operation of the left VSR of the gate driving circuit of FIG. 1.
Figure 4:
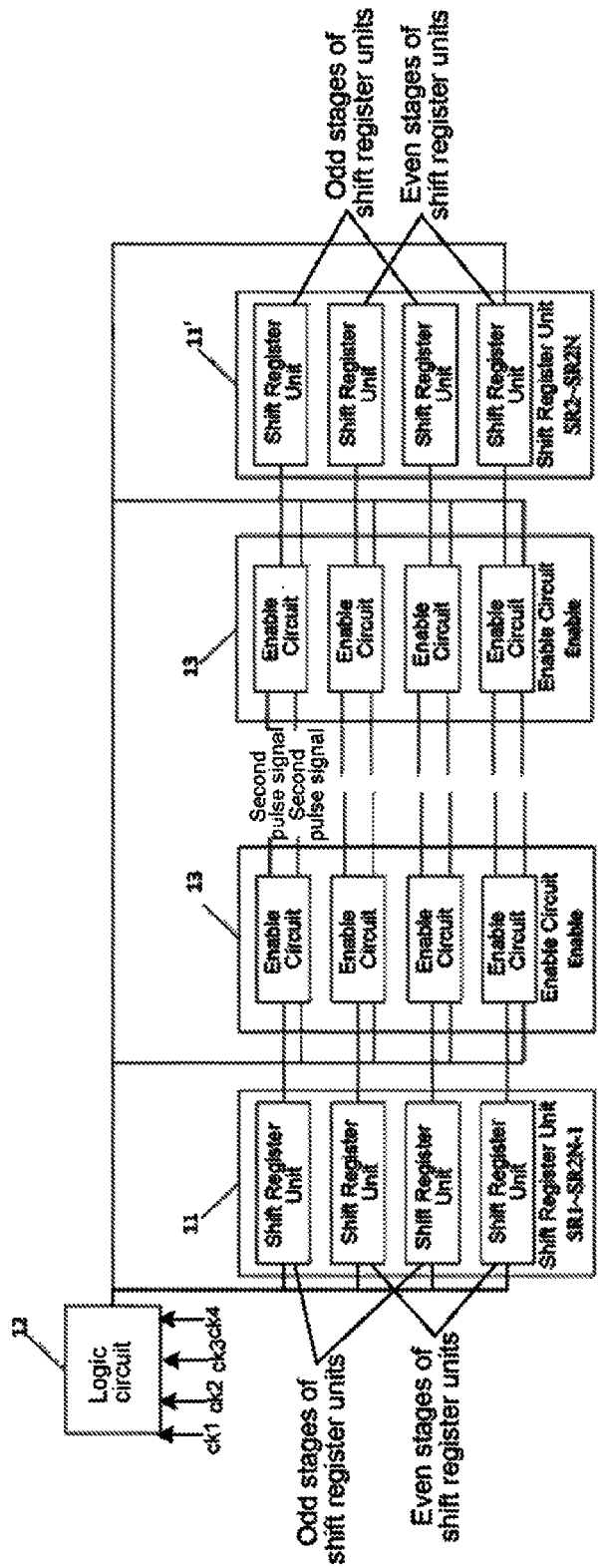
FIG. 4 is a schematic view showing a structure of a gate driving circuit according to a first embodiment of the present invention.

FIG. 4 is a schematic view showing a structure of a gate driving circuit according to a first embodiment of the present invention. The gate driving circuit provided by the first embodiment can reduce wiring space, thereby realizing a narrow frame of a display panel, and is thus particularly suitable for a TFT display panel having a small size. The gate driving circuit includes a plurality of shift register units including a first set of N stages of shift register units 11 and a second set of N stages of shift register units 11' (SR1~SRN), a logic circuit 12, and a plurality of enable circuits 13.

The logic circuit 12 is configured to receive a first clock signal ck1, a second clock signal ck2, a third clock signal ck3, and a fourth clock signal ck4, and output a logic pulse signal 14 for driving the plurality of shift register units 11 and the plurality of enable circuits 13.

In this embodiment, the logic circuit 12 is added to the shift register units 11 for converting a clock signal to a logic pulse signal to drive the plurality of shift register units 11 and the plurality of enable circuits 13.

Each of the plurality of enable circuits 13 is connected with one of the plurality of shift register units 11, and configured to receive a first pulse signal outputted by one of the shift register units and the logic pulse signal outputted by the logic circuit, and output two second pulse signals to drive two respective gate lines.

In this embodiment, each of the enable circuits is connected with a corresponding shift register unit, so that each of the enable circuits converts the two pulse signals outputted by the corresponding shift register units and the logic pulse signal outputted by the logic circuit into two pulse signals, which drive two respective gate lines. Thus, each of the shift register units is configured to control two gate lines simultaneously, and the number of the shift register units is reduced significantly, thereby reducing the wiring space and narrowing the frame of the display panel.

The pulse signal outputted by each of the shift register units and the logic pulse signal outputted by the logic circuit may be converted into two pulse signals and can be implemented in many ways consistent with the principles of the present invention. The implementations described below are exemplary embodiments.

The timing diagrams of the plurality of the second pulse signals may be in various forms. For example, in the case where one enable circuit outputs two second pulse signals to drive two adjacent gate lines and the two second pulse signals are synchronous signals complementary to each other, that is, in a time period of the two second pulse signals, one of the two second pulse signals is at a high level in a former section of the time period and is at a low level in a latter section of the time period, and the other one of the two second pulses is at a low level in the former section of the time period and is at a high level in the latter section of the time period, thus the two adjacent gate lines are driven sequentially; or the time sequence of the high levels of one of the two second pulse signals may be equal to that of the other one of the two second pulse signals, thus the two adjacent gate lines are driven simultaneously; or otherwise, the high level of one of the two second pulse signals may overlap with that of the other one of the two second pulse signals. In the cases described above, the high level duration of one of the two second pulse signals may be equal to or different from that of the other one of the two second pulse signals. Similarly, gate lines spaced apart from each other may be driven likewise by the above two second pulse signals. Certainly, for the best display effect, two adjacent gate lines are driven sequentially for the same time by the above two second pulse signals in an order by which all of the gate lines in a display substrate are driven.

In the embodiment, the plurality of enable circuits 13 are configured to convert first pulse signals outputted by the plurality of shift register units 11 and the logic pulse signal outputted by the logic circuit 12 to form a plurality of second pulse signals, which have the same frequency and amplitude but lag in sequence by a time interval depending on the number of the second pulse signals outputted by the plurality of the enable circuits 13.

According to the gate driving circuit provided by the first embodiment, the first pulse signals outputted by the shift register units and the logic pulse signal outputted by the logic circuit 12 are converted to the plurality of second pulse signals by the logic circuit 12 and the plurality of enable circuits 13, and each of the enable circuits outputs two second pulse signals, so as to charge a plurality of gate lines and hence turn on pixel TFT switches connected to the plurality of gate lines, so that the number of the shift register units can be reduced significantly, thereby reducing wiring space and narrowing the frame of a display panel. Therefore, the gate driving circuit is particularly suitable for the display panel with a small size, without a need for any change of the inner design of a liquid crystal display panel.

Based on the technical solution described above, the pulse duration of each of the second pulse signals outputted by the same enable circuit is equal to that of any other one of the second pulse signals outputted by the same enable circuit, and the high level duration of each of the second pulse signals does not overlap with that of any other one of the second pulse signals.

Based on the technical solution described above, the plurality of shift register units include: a first set of N stages of shift register units 11 formed by the 1st, 3rd, . . . , (2*N−1)-th stages of shift register units which are sequentially cascaded, and a second set of N stages of shift register units 11' formed by the 2nd, 4-th, . . . , (2*N)-th stages of shift register units which are sequentially cascaded, where the first set of N stages of shift register units are opposite to the second set of N stages of shift register units, and N is an integer greater than 1.

Based on the technical solution described above, each of the input ends of the first stage (not shown) of shift register units and the second stage (not shown) of shift register units is configured to receive a shift starting signal (not shown), and an output end of each of the 1st, 2nd, 3rd, . . . , (2*N−2)-th stages of shift register units is connected with an input end of the next stage of shift register unit, where N is an integer greater than 1.

Figure 5:
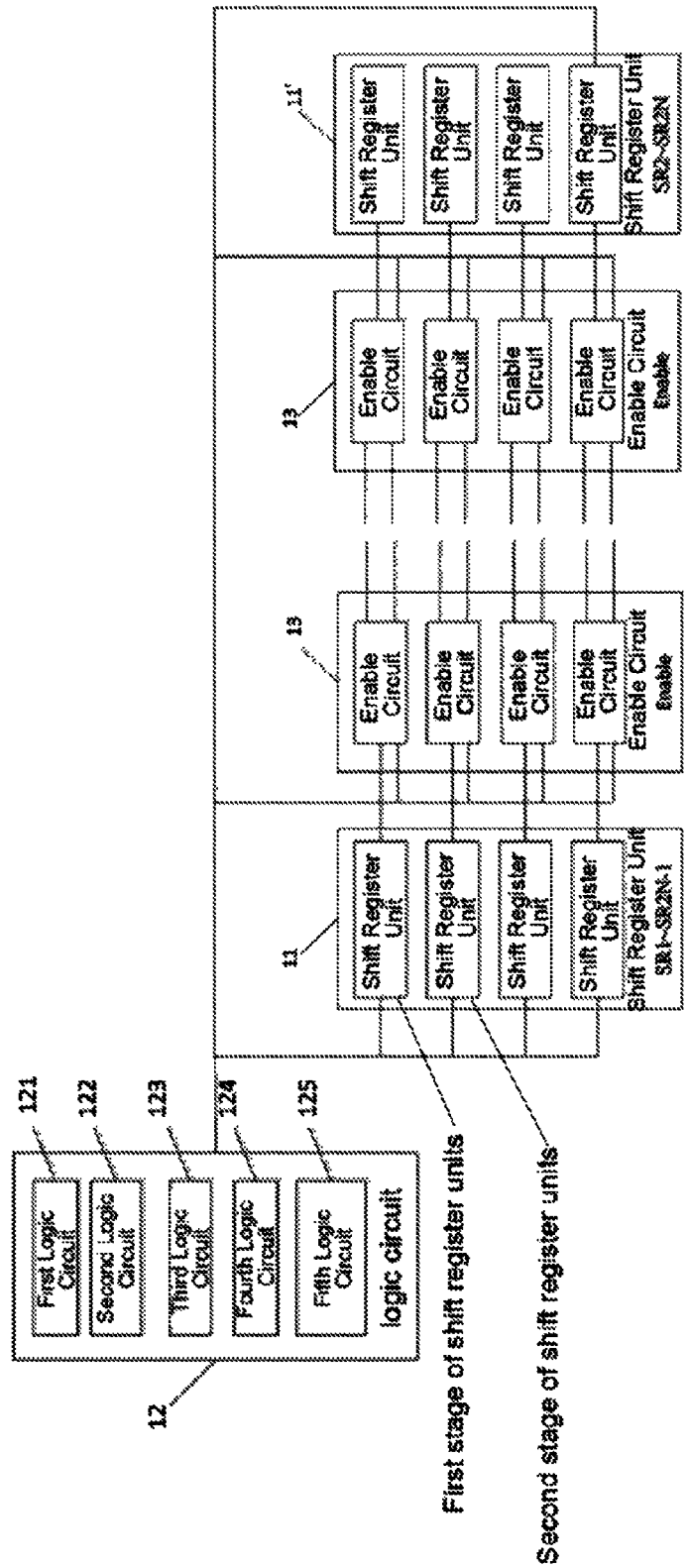
FIG. 5 is a schematic view showing a structure of a gate driving circuit according to a second embodiment of the present invention.
Figure 9:
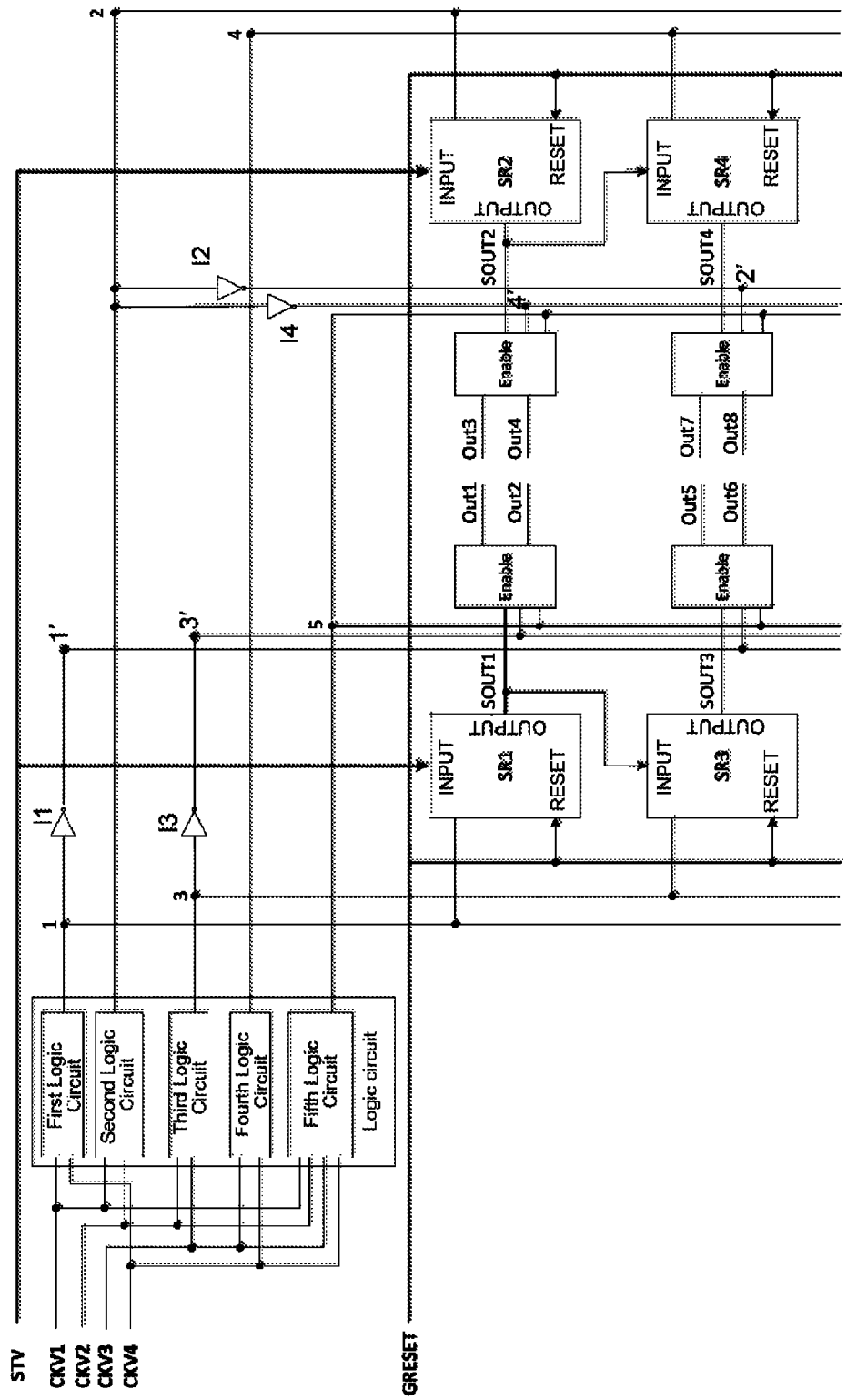
FIG. 9 is a schematic view showing a structure of a gate driving circuit according to an embodiment of the present invention.

FIGS. 5 and 9 are schematic views showing the structure of a gate driving circuit according to a second embodiment of the present invention. As shown in FIG. 5, based on the first embodiment described above, the logic circuit 12 includes a first logic circuit 121, a second logic circuit 122, a third logic circuit 123, a fourth logic circuit 124 and a fifth logic circuit 125.

The first logic circuit 121 is configured to receive a first clock signal and a fourth clock signal, and output a first logic pulse signal which drives odd stages of shift register units from the first set of N stages of shift register units.

Figure 6:
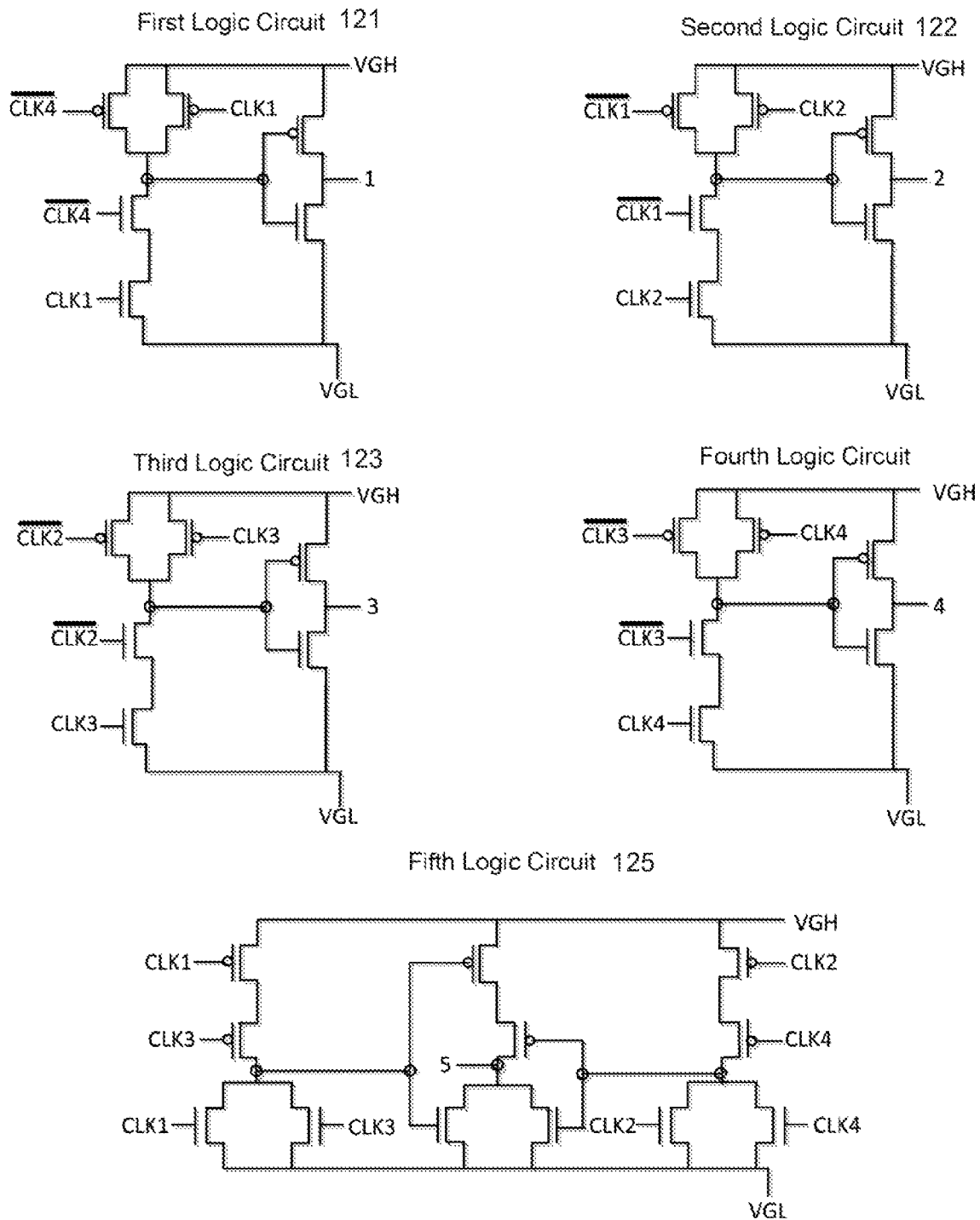
FIG. 6 is a schematic view showing structures of a first logic circuit, a second logic circuit, a third logic circuit, a fourth logic circuit and a fifth logic circuit according to the second embodiment of the present invention.
Figure 7:
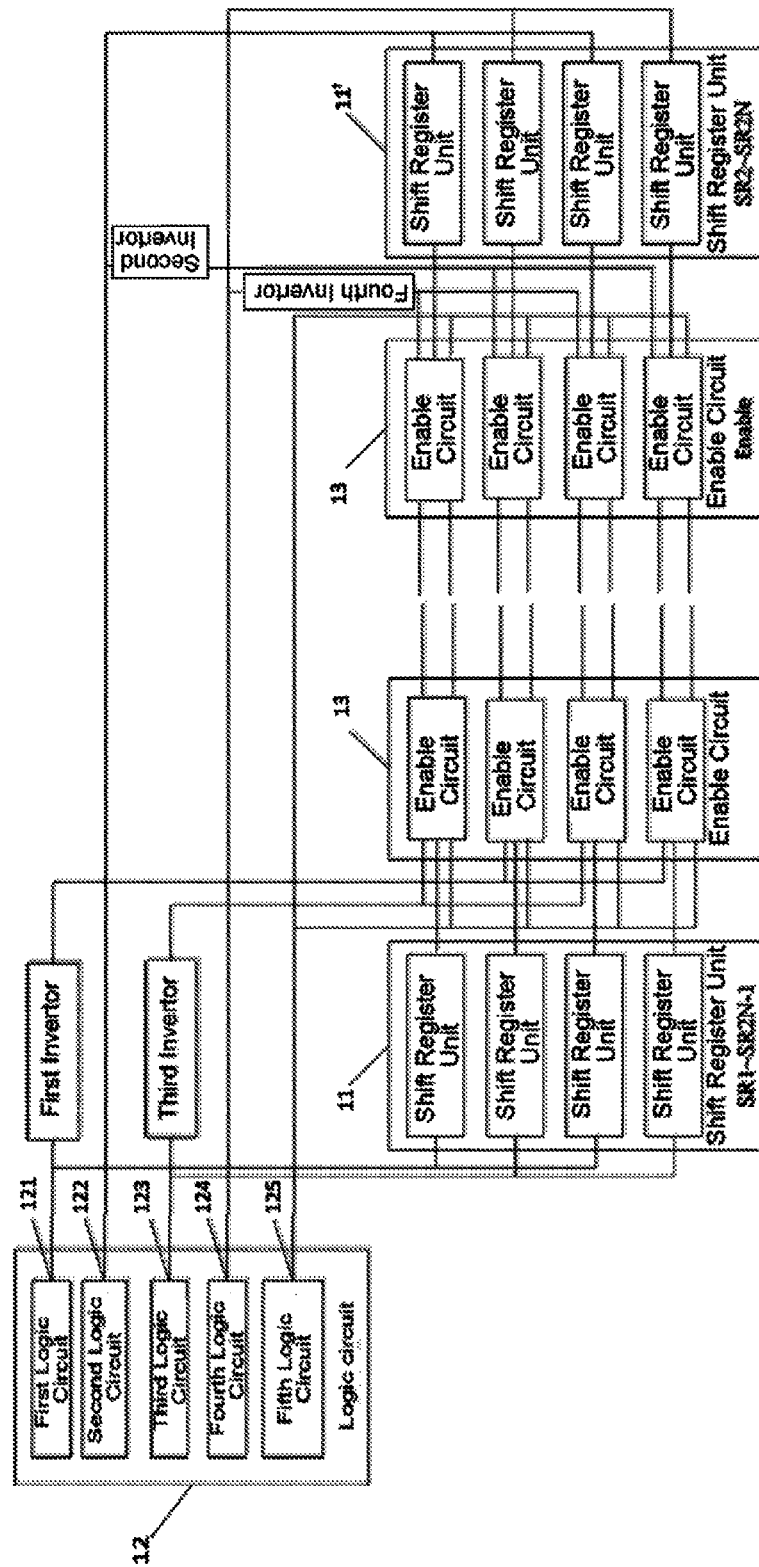
FIG. 7 is a schematic view showing a structure of a gate driving circuit according to a third embodiment of the present invention.

In this embodiment, referring to FIGS. 6 and 7, the first logic circuit 121 is configured to receive the first clock signal CLK1 and the fourth clock signal CLK4, and output a first logic pulse signal "1" to drive the odd stages of shift register units from the first set of N stages of shift register units. In FIG. 6, VGH denotes a high-voltage terminal, and VGL denotes a low-voltage terminal. The first logic pulse signal is further inputted to and inverted by a first inverter I1, which in turn outputs an inverted first logic pulse signal "1'" for driving enable circuits connected with even stages of shift register units from the first set of N stages of shift register units.

The second logic circuit 122 is configured to receive the first clock signal CLK1 and a second clock signal CLK2 and output a second logic pulse signal "2", which drives odd stages of shift register units from the second set of N stages of shift register units.

In this embodiment, referring to FIGS. 6 and 7, the second logic circuit 122 is configured to receive the first clock signal CLK1 and the second clock signal CLK2, and output the second logic pulse signal "2" to drive the odd stages of shift register units from the second set of N stages of shift register units. The second logic pulse signal is inputted to and inverted by a second inverter I2, which in turn outputs an inverted second logic pulse signal "2'" for driving enable circuits connected with even stages of shift register units from the second set of N stages of shift register units.

The third logic circuit 123 is configured to receive the second clock signal CLK2 and a third clock signal CLK3, and output a third logic pulse signal "3" for driving the even stages of shift register units from the first set of N stages of shift register units.

In this embodiment, referring to FIGS. 6 and 7, the third logic circuit is configured to receive the second clock signal and the third clock signal, and output the third logic pulse signal for driving the even stages of shift register units from the first set of N stages of shift register unit. The third logic pulse signal is inputted to and inverted by a third inverter I3, which in turn outputs an inverted third logic pulse signal "3'" for driving enable circuits connected with the odd stages of shift register units from the first set of N stages of shift register units.

The fourth logic circuit 124 is configured to receive the third clock signal and a fourth clock signal, and output a fourth logic pulse signal for driving the even stages of shift register units from the second set of N stages of shift register units.

In this embodiment, referring to FIGS. 6 and 7, the fourth logic circuit is configured to receive the third clock signal and the fourth clock signal, and output the fourth logic pulse signal for driving the even stages of shift register units from the second set of N stages of shift register units. The fourth logic pulse signal is inputted to and inverted by a fourth inverter I4, which in turn outputs an inverted fourth logic pulse signal "4'" for driving enable circuits connected with the odd stages of shift register units from the second set of N stages of shift register units.

The fifth logic circuit 125 is configured to receive the first clock signal, the second clock signal, the third clock signal and the fourth clock signal, and output a fifth logic pulse signal for driving the plurality of enable circuits.

Figure 10:
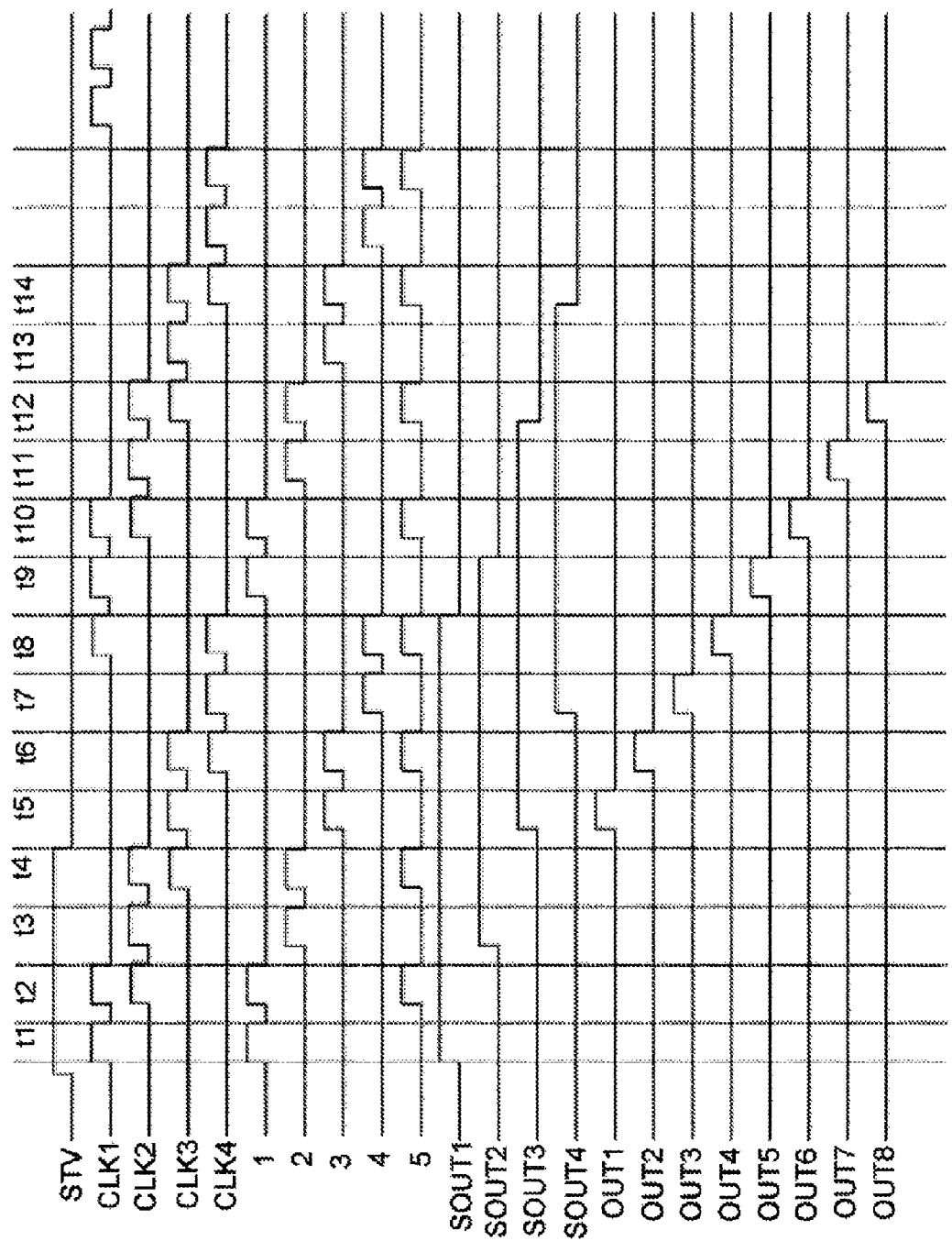
FIG. 10 is a timing diagram of a gate driving circuit according to an embodiment of the present invention.

FIG. 10 is a timing diagram of the operation of the gate driving circuit described above. A PNP transistor is turned off when being applied by a high level and is turned on when being applied by a low level, and an NPN transistor is turned on when being applied by a high level and is turned off when being applied by a low level. CLK1 represents the first clock signal, CLK2 represents the second clock signal, CLK3 represents the third clock signal and CLK4 represents the fourth clock signal. $\overline{CLK1}$, $\overline{CLK2}$, $\overline{CLK3}$ and $\overline{CLK4}$ represent a clock signal inverse to the first clock signal CLK1, a clock signal inverse to the second clock signal CLK2, a clock signal inverse to the third clock signal CLK3, and a clock signal inverse to the fourth clock signal CLK4, respectively.

With respect to the first logic circuit, during periods t1 and t2, CLK1=1 (which means that the first clock signal is at a high level), and CLK4=0, i.e., $\overline{CLK4}$=1 (which means that the clock signal $\overline{CLK4}$ is at a high level), thus a high level is outputted by the first logic pulse signal; during periods t3, t4 and t5, CLK1=0 (which means that the first clock signal is at a low level), and CLK4=0, i.e., $\overline{CLK4}$=1 (which means that the clock signal $\overline{CLK4}$ is at a high level), thus a low level is outputted by the first logic pulse signal. During periods t6 and t7, CLK1=0 (which means that the first clock signal is at a low level), and CLK4=1, i.e., $\overline{CLK4}$=0 (which means that the clock signal $\overline{CLK4}$ is at a low level), thus a low level is outputted by the first logic pulse signal; and during a period t8, CLK1=1 (which means that the first clock signal is at a high level), and CLK4=1, i.e., $\overline{CLK4}$=0 (which means that the clock signal CLK4 is at a low level), thus a low level is outputted by the first logic pulse signal.

With respect to the second logic circuit, during a period t1, CLK1=1 (which means that the first clock signal is at a high level), i.e. $\overline{CLK1}$=0, (which means that the clock signal $\overline{CLK1}$ is at a low level), and CLK2=0 (which means that the second clock signal is at a low level), thus a low level is outputted by the second logic pulse signal. During a period t2, CLK1=1, i.e. $\overline{CLK1}$=0 (which means that the clock signal $\overline{CLK1}$ is at a low level), and CLK2=1 (which means that the second clock signal is at a high level), thus a low level is outputted by the second logic pulse signal; during periods t3 and t4, CLK1=0, i.e. $\overline{CLK1}$=1 (which means that the clock signal $\overline{CLK1}$ is at a high level), and CLK2=1 (which means that the second clock signal is at a high level), thus a high level is outputted by the second logic pulse signal; during periods t5, t6 and t7, CLK1=0, i.e. $\overline{CLK1}$=1 (which means that the clock signal $\overline{CLK1}$ is at a high level), and CLK2=0 (which means that the second clock signal is at a low level), thus a low level is outputted by the second logic pulse signal; during a period t8, CLK1=1, i.e. $\overline{CLK1}$=0

(which means that the clock signal $\overline{CLK1}$ is at a low level), and CLK2=0 (which means that the second clock signal is at a low level), thus a low level is outputted by the second logic pulse signal.

With respect to the third logic circuit, during a period t1, CLK2=0, i.e. $\overline{CLK2}$=1 (which means that the clock signal $\overline{CLK2}$ is at a high level), and CLK3=0 (which means that the third clock signal is at a low level), thus a low level is outputted by the third logic pulse signal; during periods t2 and t3, CLK2=1, i.e. $\overline{CLK2}$=0 (which means that the clock signal $\overline{CLK2}$ is at a low level), and CLK3=0 (which means that the third clock signal is at a low level), thus a low level is outputted by the third logic pulse signal; during a period t4, CLK2=1, i.e. $\overline{CLK2}$=0 (which means that the clock signal $\overline{CLK2}$ is at a low level), and CLK3=1 (which means that the third clock signal is at a high level), thus a low level is outputted by the third logic pulse signal; during periods t5 and t6, CLK2=0, i.e. $\overline{CLK2}$=1 (which means that the clock signal $\overline{CLK2}$ is at a high level), and CLK3=1 (which means that the third clock signal is at a high level), thus a high level is outputted by the third logic pulse signal; during a period t7, CLK2=0, i.e. $\overline{CLK2}$=1 (which means that the clock signal $\overline{CLK2}$ is at a high level), and CLK3=0 (which means that the third clock signal is at a low level), thus a low level is outputted by the third logic pulse signal; during a period t8, CLK2=0, i.e. $\overline{CLK2}$=1 (which means that the clock signal $\overline{CLK2}$ is at a high level), and CLK3=0 (which means that the third clock signal is at a low level), thus a low level is outputted by the third logic pulse signal.

With respect to the fourth logic circuit, during periods t1, t2 and t3, CLK3=0, i.e. $\overline{CLK3}$=1 (which means that the clock signal $\overline{CLK3}$ is at a high level), and CLK4=0 (which means that the fourth clock signal is at a low level), thus a low level is outputted by the fourth logic pulse signal. During periods t4 and t5, CLK3=1, i.e. $\overline{CLK3}$=0 (which means that the clock signal $\overline{CLK3}$ is at a low level), and CLK4=0 (which means that the fourth clock signal is at a low level), thus a low level is outputted by the fourth logic pulse signal; during a period t6, CLK3=1, i.e. $\overline{CLK3}$=0 (which means that the clock signal $\overline{CLK3}$ is at a low level), and CLK4=0 (which means that the fourth clock signal is at a low level), thus a low level is outputted by the fourth logic pulse signal; during periods t7 and t8, CLK3=0, i.e. $\overline{CLK3}$=1 (which means that the clock signal $\overline{CLK3}$ is at a high level), and CLK4=1 (which means that the fourth clock signal is at a high level), thus a high level is outputted by the fourth logic pulse signal.

With respect to the fifth logic circuit, during a period t1, CLK1=1 (which means that the first clock signal is at a high level), CLK2=0 (which means that the second clock signal is at a low level), CLK3=0 (which means that the third clock signal is at a high level), and CLK4=0 (which means that the fourth clock signal is at a high level), thus a low level is outputted by the fifth logic pulse signal. During a period t2, CLK1=1 (which means that the first clock signal is at a high level), CLK2=1 (which means that the second clock signal is at a high level), CLK3=0 (which means that the third clock signal is at a low level), and CLK4=0 (which means that the fourth clock signal is at a low level), thus a high level is outputted by the fifth logic pulse signal; during a period t3, CLK1=0 (which means that the first clock signal is at a low level), CLK2=1 (which means that the second clock signal is at a high level), CLK3=0 (which means that the third clock signal is at a low level), and CLK4=0 (which means that the fourth clock signal is at a low level), thus a low level is outputted by the fifth logic pulse signal. During a period t4, CLK1=0 (which means that the first clock signal is at a low level), CLK2=1 (which means that the second clock signal is at a high level), CLK3=1 (which means that the third clock signal is at a high level) and CLK4=0 (which means that the fourth clock signal is at a low level), thus a high level is outputted by the fifth logic pulse signal. During a period t5, CLK1=0 (which means that the first clock signal is at a low level), CLK2=0 (which means that the second clock signal is at a low level), CLK3=1 (which means that the third clock signal is at a high level) and CLK4=0 (which means that the fourth clock signal is at a low level), thus a low level is outputted by the fifth logic pulse signal. During a period t6, CLK1=0 (which means that the first clock signal is at a low level), CLK2=0 (which means that the second clock signal is at a low level), CLK3=1 (which means that the third clock signal is at a high level) and CLK4=1 (which means that the fourth clock signal is at a high level), thus a high level is outputted by the fifth logic pulse signal; during a period t7, CLK1=0 (which means that the first clock signal is at a low level), CLK2=0 (which means that the second clock signal is at a low level), CLK3=0 (which means that the third clock signal is at a low level) and CLK4=1 (which means that the fourth clock signal is at a high level), thus a low level is outputted by the fifth logic pulse signal. During a period t8, CLK1=1 (which means that the first clock signal is at a high level), CLK2=0 (which means that the second clock signal is at a low level), CLK3=0 (which means that the third clock signal is at a low level) and CLK4=1 (which means that the fourth clock signal is at a high level), thus a low level is outputted by the fifth logic pulse signal.

According to the gate driving circuit provided by the second embodiment, each of the five logic pulse signals outputted by the five logic circuits is used to drive a plurality of shift register units and a plurality of enable circuits, where each of the shift register units is configured to drive two adjacent gate lines to reduce the number of the shift register units and wiring space, thereby narrowing the frame of the display panel.

Based on the solution described above, the first logic pulse signal is inverted by the first inverter I1 to output the inverted first logic pulse signal for driving the enable circuits which are connected with the even stages of shift register units from the first set of N stages of shift register units, the second logic pulse signal is inverted by the second inverter I2 to output the inverted second logic pulse signal for driving the enable circuits which are connected with the even stages of shift register units from the second set of N stages of shift register units, the third logic pulse signal is inverted by the third inverter I3 to output the inverted third logic pulse signal for driving the enable circuits which are connected with the odd stages of shift register units from the first set of N stages of shift register units, and the fourth logic pulse signal is inverted by the fourth inverter I4 to output the inverted fourth logic pulse signal for driving the enable circuits which are connected with the odd stages of shift register units from the second set of N stages of shift register units.

Figure 8:
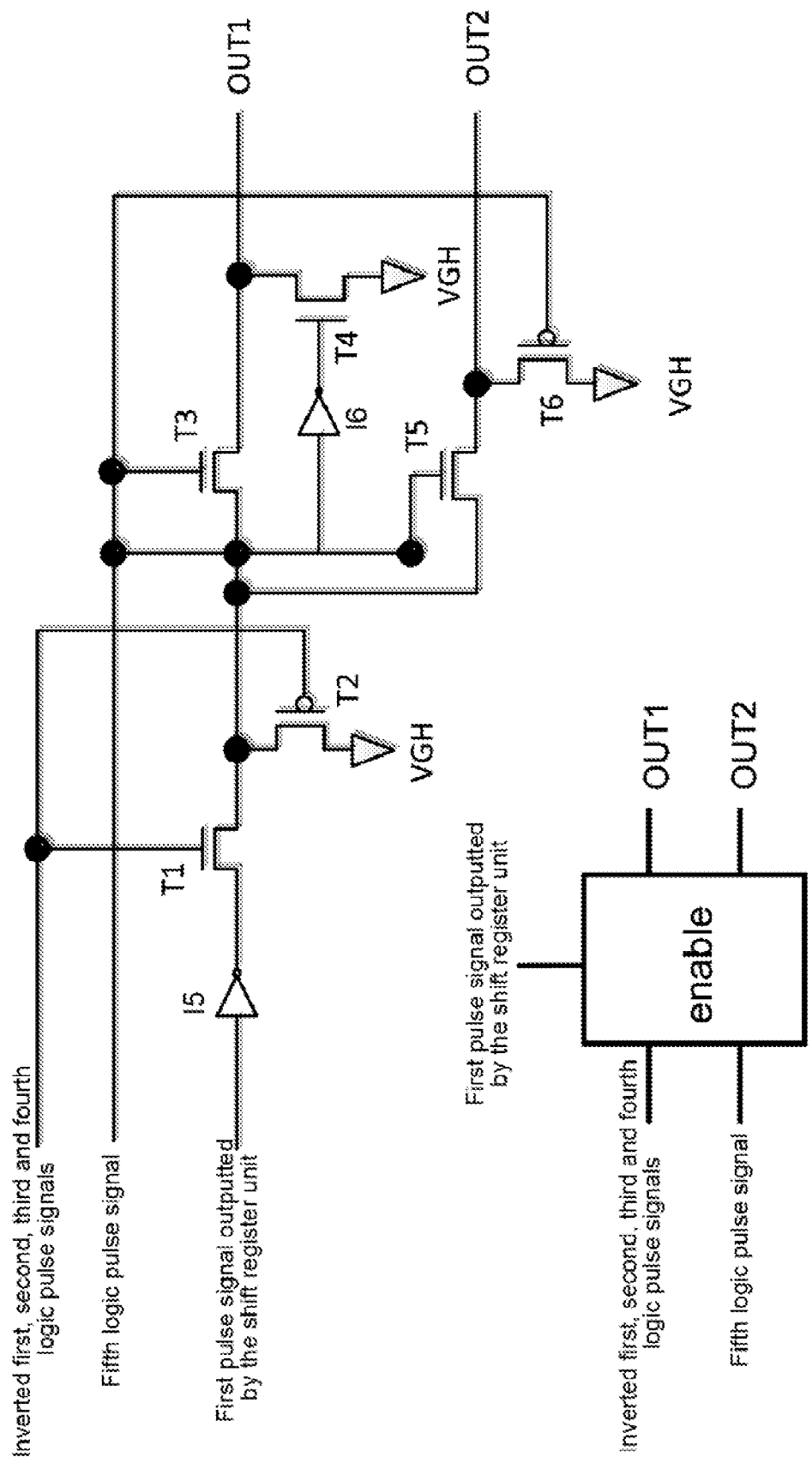
FIG. 8 is a schematic view showing a structure of an enable circuit according to the third embodiment of the present invention.

FIGS. 7, 8 and 9 are schematic views showing a structure of a gate driving circuit according to a third embodiment of the present invention. The third embodiment is different from the first and second embodiments described above in that each of the plurality of enable circuits 13 includes: a first thin film transistor T1, a second thin film transistor T2, a third thin film transistor T3, a fourth thin film transistor T4, a fifth thin film transistor T5, a sixth thin film transistor T6, a fifth inverter I5 and a sixth inverter I6.

A source electrode of the first thin film transistor T1 is connected with an output end of the shift register unit via the fifth inverter, a drain electrode of the first thin film transistor T1 is connected with source electrodes of the third thin film transistor T3, the second thin film transistor T2, and the fifth thin film transistor T5.

The source electrode of the second thin film transistor T2 is configured to receive a high level signal, and a drain electrode of the second thin film transistor T2 is connected with the drain electrode of the first thin film transistor T1.

In the case of the enable circuits connected with the odd stages of shift register units from the first set of N stages of shift register units, gate electrodes of the first thin film transistor T1 and the second thin film transistor T2 in each of the enable circuits are configured to receive the inverted first logic pulse signal. In the case of the enable circuits connected with the odd stages of shift register units from the second set of N stages of shift register units, gate electrodes of the first thin film transistor T1 and the second thin film transistor T2 in each of the enable circuits are configured to receive the inverted second logic pulse signal. In the case of the enable circuits connected with the even stages of shift register units from the first set of N stages of shift register units, gate electrodes of the first thin film transistor T1 and the second thin film transistor T2 of each of the enable circuits are configured to receive the inverted third logic pulse signal. In the case of the enable circuits connected with the even stages of shift register units from the second set of N stages of shift register units, gate electrodes of the first thin film transistor T1 and the second thin film transistor T2 of each of the enable circuits are configured to receive the inverted fourth logic pulse signal.

The source electrode of the third thin film transistor T3 is connected with the drain electrode of the first thin film transistor T2, and the drain electrode of the third thin film transistor T3 is connected with one of those two output terminals OUT1 of the enable circuit, and the gate electrode of the third thin film transistor T3 is configured to receive the fifth logic pulse signal.

The source electrode of the fourth thin film transistor T4 is configured to receive a high level signal, the drain electrode of the fourth thin film transistor T4 is connected with said one of those two output terminals OUT1 of the enable circuit, and the gate electrode of the fourth thin film transistor T4 is configured to receive the fifth logic pulse signal by the sixth inverter.

The source electrode of the fifth thin film transistor T5 is connected with the drain electrode of the first thin film transistor T1, the drain electrode of the fifth thin film transistor T5 is connected with the other one of those two output terminals OUT2 of the enable circuit, and the gate electrode of the fifth thin film transistor T5 is configured to receive the fifth logic pulse signal.

The source electrode of the sixth thin film transistor T6 is configured to receive a high level signal, a drain electrode of the sixth thin film transistor T6 is connected with said the other one of those two output terminals OUT2 of the enable circuits, and the gate electrode of the sixth thin film transistor T6 is configured to receive the fifth logic pulse signal.

As shown in FIG. 10, which is a timing diagram of operations of the gate driving circuit described above. A PNP transistor is turned off when being applied by a high level and is turned on when being applied by a low level, and an NPN transistor is turned on when being applied by a high level and is turned off when being applied by a low level. SOUT1, SOUT2, . . . , SOUTN represent the first pulse signals outputted by the shift register units SR1, SR2, . . . , SR2N, respectively.

Each of the enable circuits corresponding to the odd stages of shift register units (for example, a shift register unit SR1) from the first set of N stages of shift register units converts the first pulse signal, the inverted third logic pulse signal and the fifth logic pulse signal into two second pulse signals which are output at the output terminals OUT1 and OUT2. During a period t1, SOUT=1, that is the level of the first pulse signal SOUT1 is high, the level of the third logic pulse signal is low and hence the level of the inverted third logic pulse signal is high, and the level of the fifth logic pulse signal is low, thus a low level is outputted by any of the output terminals OUT1 and OUT2. During a period t2, SOUT=1, that is the level of the first pulse signal SOUT1 is high, the level of the third logic pulse signal is low and hence the level of the inverted third logic pulse signal is high, and the level of the fifth logic pulse signal is high, thus a low level is outputted by any of the output terminals OUT1 and OUT2. During a period t3, SOUT=1, that is the level of the first pulse signal SOUT1 is high, the level of the third logic pulse signal is low and hence the level of the inverted third logic pulse signal is high, and the level of the fifth logic pulse signal is low, thus a low level is outputted by any of the output terminals OUT1 and OUT2. During a period t4, SOUT=1, that is the level of the first pulse signal SOUT1 is high, the level of the third logic pulse signal is low and hence the level of the inverted third logic pulse signal is high, and the level of the fifth logic pulse signal is high, thus a low level is outputted by any of the output terminals OUT1 and OUT2. During a period t5, SOUT=1, that is the level of the first pulse signal SOUT1 is high, the level of the third logic pulse signal is high and hence the level of the inverted third logic pulse signal is low, and the level of the fifth logic pulse signal is low, thus a high level is outputted by the output terminal OUT1 and a low level is outputted by the output terminal OUT2. During a period t6, SOUT=1, that is the level of the first pulse signal SOUT1 is high, the level of the third logic pulse signal is high and hence the level of the inverted third logic pulse signal is low, and the level of the fifth logic pulse signal is high, thus a low level is outputted by the output terminal SOUT1 and a high level is outputted by the output terminal OUT2. During a period t7, SOUT1=1, that is the level of the first pulse signal SOUT1 is high, the level of the third logic pulse signal is low and hence the level of the inverted third logic pulse signal is high, and the level of the fifth logic pulse signal is low, thus a low level is outputted by any of the output terminals OUT1 and OUT2; and during a period t8, SOUT=1, that is the level of the first pulse signal SOUT1 is high, the level of the third logic pulse signal is low and hence the level of the inverted third logic pulse signal is high, and the level of the fifth logic pulse signal is high, thus a low level is outputted by any of the output terminals OUT1 and OUT2.

Each of the enable circuits corresponding to the odd stages of shift register units (for example, SR2) from the second set of N stages of shift register units converts the first pulse signal, the inverted fourth logic pulse signal and the fifth logic pulse signal into two second pulse signals which are output at the output terminals OUT3 and OUT4. During a period t1, SOUT2=0, that is the level of the first pulse signal SOUT2 is low, the level of the fourth logic pulse signal is low and hence the level of the inverted fourth logic pulse signal is high, and the level of the fifth logic pulse signal is low, thus a low level is outputted by any of the output terminals OUT3 and OUT4. During a t2 period, SOUT2=0, that is the level of the first pulse signal SOUT2 is low, the level of the fourth logic pulse signal is low and hence the level of the inverted fourth logic pulse signal is high, and the level of the fifth logic pulse signal is high, thus a low level is outputted by any of the output terminals OUT3 and OUT4. During a period t3, SOUT2=1, that is the level of the first pulse signal SOUT2 is high, the level of the fourth logic pulse signal is low and hence the inverted fourth logic pulse signal is high, and the level of the fifth logic pulse signal is low, thus a low level is outputted by any of the output terminals OUT3 and OUT4. During a period t4, SOUT2=1, that is the level of the first pulse signal SOUT2 is high, the level of the fourth logic pulse signal is low and hence the inverted fourth logic pulse signal is high, and the level of the fifth logic pulse signal is high, thus a low level is outputted by any of the output terminals OUT3 and OUT4. During a period t5, SOUT2=1, that is the level of the first pulse signal SOUT2 is high, the level of the fourth logic pulse signal is low and hence the level of the inverted fourth logic pulse signal is high, and the level of the fifth logic pulse signal is low, thus a low level is outputted by any of the output terminals OUT3 and OUT4. During a period t6, SOUT2=1, that is the level of the first pulse signal SOUT2 is high, the level of the fourth logic pulse signal is low and hence the level of the inverted fourth logic pulse signal is high, and the level of the fifth logic pulse signal is high, thus a low level is outputted by any of the output terminals OUT3 and OUT4; during a period t7, SOUT2=1, that is the level of the first pulse signal SOUT2 is high, the level of the fourth logic pulse signal is high and hence the level of the inverted fourth logic pulse signal is low, and the level of the fifth logic pulse signal is low, thus a high level is outputted by the output terminal OUT3 and a low level is outputted by the output terminal OUT4. During a period t8, SOUT2=1, that is the level of the first pulse signal SOUT2 is high, the level of the fourth logic pulse signal is high and hence the level of the inverted fourth logic pulse signal is low, and the level of the fifth logic pulse signal is high, thus a low level is outputted by the output terminal OUT3 and a high level is outputted by the output terminal OUT4.

Each of the enable circuits corresponding to the even stages of shift register units (for example, SR3) from the first set of N stages of shift register units converts the first pulse signal, the inverted first logic pulse signal and the fifth logic pulse signal into two second pulse signals which are output at the output terminals OUT5 and OUT6. During a period t1, SOUT3=0, that is the level of the first pulse signal SOUT3 is low, the level of the first logic pulse is high and hence the level of the inverted first logic pulse signal is low, and the level of the fifth logic pulse signal is low, thus a low level is outputted by any of the output terminals OUT5 and OUT6; during a period t2, SOUT3=0, that is the level of the first pulse signal SOUT3 is low, the level of the first logic pulse signal is high and hence the inverted first logic pulse signal is low, and the level of the fifth logic pulse signal is high, thus a low level is outputted by any of the output terminals OUT5 and OUT6. During a period t3, SOUT3=0, that is the level of the first pulse signal SOUT3 is low, the level of the first logic pulse signal is low and hence the level of the inverted first logic pulse signal is high, and the level of the fifth logic pulse signal is low, thus a low level is outputted by any of the output terminals OUT5 and OUT6. During a period t4, SOUT3=0, that is the level of the first pulse signal SOUT3 is low, the level of the first logic pulse signal is low and hence the level of the inverted first logic pulse signal is high, and the level of the fifth logic pulse signal is high, thus a low level is outputted by any of the output terminals OUT5 and OUT6; during a period t5, SOUT3=1, that is the level of the first pulse signal SOUT3 is high, the level of the first logic pulse signal is low and hence the level of the inverted first logic pulse signal is high, and the level of the fifth logic pulse signal is low, thus a low level is outputted by any of the output terminals OUT5 and OUT6. During a period t6, SOUT3=1, that is the level of the first pulse signal SOUT3 is high, the level of the first logic pulse signal is low and hence the level of the inverted first logic pulse signal is high, and the level of the fifth logic pulse signal is high, thus a low level is outputted by any of the output terminals OUT5 and OUT6. During a period t7, SOUT3=1, that is the level of the first pulse signal SOUT3 is high, the level of the first logic pulse signal is low and hence the level of the inverted first logic pulse signal is high, and the level of the fifth logic pulse signal is low, thus a low level is outputted by any of the output terminals OUT5 and OUT6; during a period t8, SOUT3=1, that is the level of the first pulse signal SOUT3 is high, the level of the first logic pulse signal is low and hence the level of the inverted first logic pulse signal is high, and the level of the fifth logic pulse signal is high, thus a low level is outputted by any of the output terminals OUT5 and OUT6; during a period t9, SOUT3=1, that is the level of the first pulse signal SOUT3 is high, the level of the first logic pulse signal is high and hence the level of the inverted first logic pulse signal is low, and the level of the fifth logic pulse signal is high, thus a high level is outputted by the output terminal SOUT5 and a low level is outputted by the output terminal OUT6; during a period t10, SOUT3=1, that is the level of the first pulse signal SOUT3 is high, the level of the first logic pulse signal is high and hence the level of the inverted first logic pulse signal is low, and the level of the fifth logic pulse signal is high, thus a low level is outputted by the output terminal SOUT5 and a high level is outputted by the output terminal OUT6.

Each of the enable circuits corresponding to the even stags of shift register units (for example, SR4) from the second set of N stages of shift register units converts the first pulse signal, the inverted second logic pulse signal and the fifth logic pulse signal into two second pulse signals which are output at the output terminals OUT7 and OUT8. During a period t1, SOUT4=0, that is the level of the first pulse signal SOUT4 is low, the level of the second logic pulse is low and hence the level of the inverted second logic pulse signal is high, and the level of the fifth logic pulse signal is low, thus a low level is outputted by any of the output terminals OUT7 and OUT8. During a period t2, SOUT4=0, that is the level of the first pulse signal SOUT4 is low, the level of the second logic pulse signal is low and hence the level of the inverted second logic pulse signal is high, and the level of the fifth logic pulse signal is high, thus a low level is outputted by any of the output terminals OUT7 and OUT8. During a period t3, SOUT4=0, that is the level of the first pulse signal SOUT4 is low, the level of the second logic pulse signal is high and hence the level of the inverted second logic pulse signal is low, and the level of the fifth logic pulse signal is low, thus a low level is outputted by any of the output terminals OUT7 and OUT8. During a period t4, SOUT4=0, that is the level of the first pulse signal SOUT4 is low, the level of the second logic pulse signal is high and hence the level of the inverted second logic pulse signal is low, and the level of the fifth logic pulse signal is high, thus a low level is outputted by any of the output terminals OUT7 and OUT8. During a period t5, SOUT4=0, that is the level of the first pulse signal SOUT4 is low, the level of the second logic pulse signal is low and hence the level of the inverted second logic pulse signal is high, and the level of the fifth logic pulse signal is low, thus a low level is outputted by any of the output terminals OUT7 and OUT8. During a period t6, SOUT4=0, that is the level of the first pulse signal SOUT4 is low, the level of the second logic pulse signal is low and hence the level of the inverted second logic pulse signal is high, and the level of the fifth logic pulse signal is high, thus a low level is outputted by any of the output terminals OUT7 and OUT8. During a period t7, SOUT4=1, that is the level of the first pulse signal SOUT4 is high, the level of the second logic pulse signal is low and hence the level of the inverted second logic pulse signal is high, and the level of the fifth logic pulse signal is low, thus a low level is outputted by any of the output terminals OUT7 and OUT8; during a period t8, SOUT4=1, that is the level of the first pulse signal SOUT4 is high, the level of the second logic pulse signal is low and hence the level of the inverted second logic pulse signal is high, and the level of the fifth logic pulse signal is high, thus a low level is outputted by any of the output terminals OUT7 and OUT8; during a period t9, SOUT4=1, that is the level of the first pulse signal SOUT4 is high, the level of the second logic pulse signal is low and hence the level of the inverted second logic pulse signal is high, and the level of the fifth logic pulse signal is low, thus a low level is outputted by any of the output terminals OUT7 and OUT8. During a period t10, SOUT4=1, that is the level of the first pulse signal SOUT4 is high, the level of the second logic pulse signal is low and hence the level of the inverted second logic pulse signal is high, and the level of the fifth logic pulse signal is high, thus a low level is outputted by any of the output terminals OUT7 and OUT8; during a period t11, SOUT4=1, that is the level of the first pulse signal SOUT4 is high, the level of the second logic pulse signal is high and hence the level of the inverted second logic pulse signal is low, and the level of the fifth logic pulse signal is low, thus a low level is outputted by the output terminal OUT7 and a high level is outputted by the output terminal OUT8; during a period t12, SOUT4=1, that is the level of the first pulse signal SOUT4 is high, the level of the second logic pulse signal is high and hence the level of the inverted second logic pulse signal is low, and the level of the fifth logic pulse signal is high, thus a low level is outputted by the output terminal OUT7 and a high level is outputted by the output terminal OUT8.

The above operations are sequentially performed until the final stage of shift register unit. Finally, signals (e.g. from the output terminals OUT1, OUT2, . . . , OUT8) as illustrated in FIG. 10 are obtained by the gate lines, to drive the gate lines and control the turning on and off of the pixel TFTs along the respective gate lines.

With the gate driving circuit provided by the third embodiment, the plurality of first pulse signals outputted by the plurality of shift register units and the logic pulse signal outputted by the logic circuit are converted into the plurality of second pulse signals by the plurality of enable circuits, and each of the plurality of enable circuits is configured to output two second pulse signals, thus two adjacent gate lines can be driven by each of the plurality shift register units to reduce the number of the shift register units, thereby reducing wiring space and narrowing the frame of the display panel.

The fourth embodiment of the present invention provides a display device, including: a display region including a plurality of pixels configured to display images; a gate driving circuit which is configured to transfer scanning signals to the display region; and a data driving circuit which is configured to transfer data signals to the display region. The gate driving circuit may be, for example, any one of the gate driving circuits described in the first embodiment, the second embodiment and the third embodiment. Due to the incorporation of the gate driving circuits described above, the display device is eventually advantageous for the corresponding advantageous effects.

Although the embodiments of the present invention and the technical principles used therein are described as above, it should be appreciated by those skilled in the art that the present invention is not limited to the particular embodiments described herein, and any apparent alterations, modification and substitutions can be made by those skilled in the art without departing from the scope of protection of the present invention. Accordingly, while the present invention are described in detail through the above embodiments, the present invention is not merely limited to the above embodiments and can further include other additional equivalent embodiments without departing from the concept of the present invention. The scope of the present invention should be subject to the appended claims.

What is claimed is:

1. A gate driving circuit in a display device, comprising:
a plurality of shift register units;
a plurality of enable circuits, each connecting to an associated shift register unit and driving two associated gate lines;
a logic circuit configured to receive a first clock signal (CLK1), a second clock signal (CLK2), a third clock signal (CLK3) and a fourth clock signal (CLK4), and output a first logic signal, a second logic signal, a third logic signal, a fourth logic signal, and a fifth logic signal;
wherein the plurality of shift register units comprises:
a first shift register unit configured to receive the first logic signal,
a second shift register unit configured to receive the second logic signal,
a third shift register unit configured to receive the third logic signal, and
a fourth shift register unit configured to receive the fourth logic signal,
wherein the plurality of enable circuits comprises,
a first enable circuit connected with the first shift register unit and configured to receive the third logic signal and the fifth logic signal,
a second enable circuit connected with the second shift register unit and configured to receive the fourth logic signal and the fifth logic signal,
a third enable circuit connected with the third shift register unit and configured to receive the first logic signal and the fifth logic signal, and
a fourth enable circuit connected with the fourth shift register unit and configured to receive the second logic signal and the fifth logic signal.

2. The gate driving circuit of claim 1, wherein:
each of the plurality of enable circuits outputs a first output signal and a second output signal, the pulse duration of the first output signal is equal to the pulse duration of the second output signal.

3. The gate driving circuit of claim 1, wherein,
the plurality of shift register units comprises a first set of cascaded shift register units and a second set of cascaded shift register units opposite to the first set of cascaded shift register units.

4. The gate driving circuit of claim 3, wherein
the first set of cascaded shift register units comprises a plurality of first shift register units and a plurality of third shift register units; and the second set of cascaded shift register units comprises a plurality of second shift register units and a plurality of fourth shift register units.

5. The gate driving circuit of claim 1, wherein
each of the enable circuits comprises a first thin film transistor, a second thin film transistor, a third thin film transistor, a fourth thin film transistor, a fifth thin film transistor, a sixth thin film transistor, a fifth invertor and a sixth inverter; wherein:
a source electrode of the first thin film transistor is connected, via the fifth invertor, with an output end of the shift register unit connected with the enable circuit, and a drain electrode of the first thin film transistor is connected with a source electrode of the third thin film transistor, a source of the second thin film transistor and a source electrode of the fifth thin film transistor;
the source electrode of the second thin film transistor is configured to receive a high level signal, and a drain electrode of the second thin film transistor is connected with the drain electrode of the first thin film transistor;
in the case of an enable circuit connected with an odd stage of shift register units from the first set of N stages of shift register units, a gate electrode of the first thin film transistor and a gate electrode of the second thin film transistor are configured to receive the inverted first logic pulse signal;
in the case of an enable circuit connected with an odd stage of shift register units from the second set of N stages of shift register units, the gate electrode of the first thin film transistor and the gate electrode of the second thin film transistor are configured to receive the inverted second logic pulse signal;
in the case of an enable circuit connected with an even stage of shift register units from the first set of N stages of shift register units, the gate electrode of the first thin film transistor and the gate electrode of the second thin film transistor are configured to receive the inverted third logic pulse signal; and
in the case of an enable circuit connected with an even stage of shift register units from the second set of N stages of shift register units, the gate electrode of the first thin film transistor and the gate electrode of the second thin film transistor are configured to receive the inverted fourth logic pulse signal;
the source electrode of the third thin film transistor is connected with the drain electrode of the first thin film transistor, a drain electrode of the third thin film transistor is connected with one of two output terminals of the enable circuit, and a gate electrode of the third thin film transistor is configured to receive the fifth logic pulse signal;
a source electrode of the fourth thin film transistor is configured to receive a high level, a drain electrode of the fourth thin film transistor is connected with said one of the two output terminals of the enable circuit, and a gate electrode of the fourth thin film transistor is configured to receive the fifth logic pulse signal via the sixth inverter;
the source electrode of the fifth thin film transistor is connected with the drain electrode of the first thin film transistor, a drain electrode of the fifth thin film transistor is connected with the other of the two output terminals of the enable circuit, and a gate electrode of the fifth thin film transistor is configured to receive the fifth logic pulse signal; and
a source electrode of the sixth thin film transistor is configured to receive a high level signal, a drain electrode of the sixth thin film transistor is connected with the other of the two output terminals of the enable circuit, and a gate electrode of the sixth thin film transistor is configured to receive the fifth logic pulse signal.

6. The gate driving circuit of claim 1, wherein the first logic signal is equal to $CLK1*\overline{CLK4}$, the second logic signal is equal to $CLK2*\overline{CLK1}$, the third logic signal is equal to $CLK3*\overline{CLK2}$, the fourth logic signal is equal to $CLK4*\overline{CLK3}$, and the fifth logic signal is equal to $\overline{CLK1+CLK3+CLK2+CLK4}$,
wherein the operator − represents a logic invert operation, the operator * represents a logic AND operation, and the operator + represents a logic OR operation.

7. The gate driving circuit of claim 1, wherein
when the third logic signal and the fifth logic signal are at a first logical level, the first enable circuit drives one of the respective two gate lines, when the third logic signal is at the first logic level and the fifth logic signal is at a second logical level, the first enable circuit drives the other one of the respective two gate lines;
when the fourth logic signal and the fifth logic signal are at the first logical level, the second enable circuit drives one of the respective two gate lines, when the fourth logic signal is at the first logic level and the fifth logic signal is at the second logical level, the second enable circuit drives the other one of the respective two gate lines;
when the first logic signal and the fifth logic signal are at the first logical level, the third enable circuit drives one of the respective two gate lines, when the first logic signal is at the first logic level and the fifth logic signal is at the second logical level, the third enable circuit drives the other one of the respective two gate lines; and
when the second logic signal and the fifth logic signal are at the first logical level, the fourth enable circuit drives one of the respective two gate lines, when the second logic signal is at the first logic level and the fifth logic signal is at the second logical level, the fourth enable circuit drives the other one of the respective two gate lines.

8. The gate driving circuit of claim 1, wherein the first logical level is one of a high level and a low level, and the second logical level is the other one of the high level and the low level.

9. A display device comprising:
a display region comprising a plurality of pixels for displaying images;
a gate driving circuit configured to transfer scanning signals to the display region; and
a data driving circuit configured to transfer data signals to the display region;
wherein the gate driving circuit comprises:
a plurality of shift register units;
a plurality of enable circuits, each connecting to an associated shift register unit and driving two associated gate lines;
a logic circuit configured to receive a first clock signal (CLK1), a second clock signal (CLK2), a third clock signal (CLK3) and a fourth clock signal (CLK4), and output a first logic signal, a second logic signal, a third logic signal, a fourth logic signal and a fifth logic signal;
wherein the plurality of shift register units comprises, a first shift register unit configured to receive the first logic signal;

a second shift register unit configured to receive the second logic signal, a third shift register unit configured to receive the third logic signal, and a fourth shift register unit configured to receive the fourth logic signal, wherein the plurality of enable circuits comprises, a first enable circuit connected with the first shift register unit and configured to receive the third logic signal and the fifth logic signal, a second enable circuit connected with the second shift register unit and configured to receive the fourth logic signal and the fifth logic signal, a third enable circuit connected with the third shift register unit and configured to receive the first logic signal and the fifth logic signal, and a fourth enable circuit connected with the fourth shift register unit and configured to receive the second logic signal and the fifth logic signal.

10. The display device of claim 9, wherein each of the plurality of enable circuits outputs a first output signal and a second output signal, the pulse duration of the first output signal is equal to the pulse duration of the second output signal.

11. The display device of claim 9, wherein the plurality of shift register units comprise a first set of cascaded shift register units and a second set of cascaded shift register units opposite to the first set of cascaded shift register units.

12. The display device of claim 11, wherein the first set of cascaded shift register units comprises a plurality of first shift register units and a plurality of third shift register units; and the second set of cascaded shift register units comprises a plurality of second shift register units and a plurality of fourth shift register units.

* * * * *